CIRCUIT ARRANGEMENT FOR THE AUTOMATIC REGULATION OF AN OSCILLATOR TO A REFERENCE FREQUENCY
Filed June 3, 1965
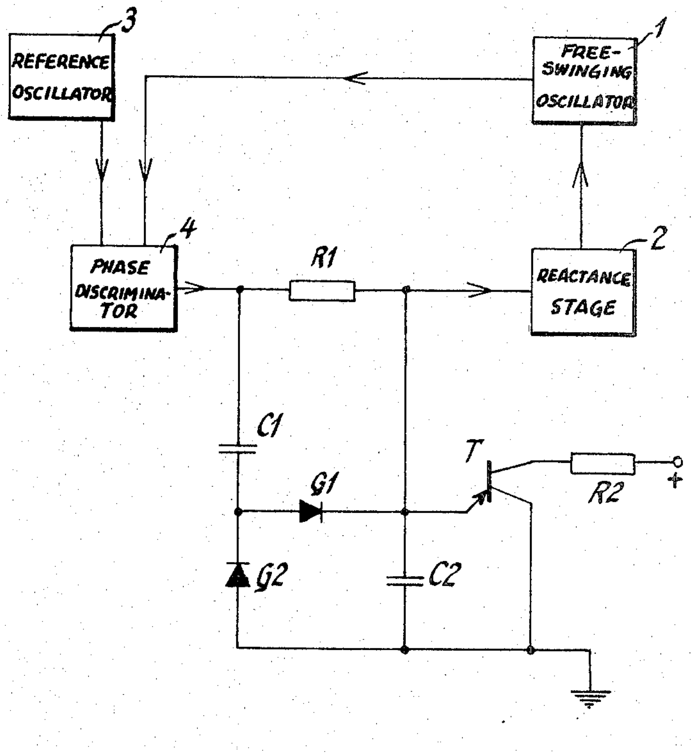
INVENTOR.
GOTTFRIED TSCHANNEN
BY Mc Glew & Toren
ATTORNEYS United States Patent Office 3,293,560

Patented Dec. 20, 1966

3,293,560

CIRCUIT ARRANGEMENT FOR THE AUTOMATIC REGULATION OF AN OSCILLATOR TO A REFERENCE FREQUENCY

Gottfried Tschannen, Zurich, Switzerland, assignor to Albiswerk Zurich A.G., Zurich, Switzerland Filed June 3, 1965, Ser. No. 461,024
Claims priority, application Switzerland, Sept. 24, 1964, 12,422/64
3 Claims. (Cl. 331—4)

This invention relates to the automatic regulation of the frequency of an oscillator to a reference frequency and, more particularly, to a novel and simplified circuit for such automatic regulation of an oscillator frequency, utilizing a phase discriminator to compare the frequency of the oscillator to be controlled with a reference frequency to derive a differential frequency producing a control voltage controlling a finder oscillator acting on the reactance stage of the main oscillator, and which finder oscillator overlaps the pull-in range of the main oscillator and shuts off upon occurrence of synchronization.

In the absence of regulation, the frequency of an oscillator, such as a free swinging oscillator, is subject to variations so that it differs from a preset, desired or nominal frequency. The frequency variations may be distinguished as to slow frequency variations and rapid frequency variations. The slow frequency variations are caused, by way of example, by variations of the operating voltage and by aging. On the other hand, the rapid frequency variations are caused by static interference. The slow frequency variation determines the size of the necessary pull-in range, whereas the rapid frequency variation determines the necessary control time of the fine tuning.

In general, the term "pull-in" range is understood to mean the largest possible fine tuning range for a free-swinging oscillator. Within this range, and in the absence of synchronization, the control system must be able to regulate the oscillator to the reference frequency without residual errors.

In the holding range, frequency variation of the oscillator is compensated, for the purposes of synchronizing, by the control voltage. The pull-in range is always smaller than the holding range. In well laid out circuits, however, the difference between these two ranges is very small.

Known frequency regulating arrangements rely primarily upon two systems. One of these systems is phase comparison, which yields an integral regulator. The other system is frequency comparison, which yields a proportional integrator. The outstanding advantages of the phase comparison system are offset by the disadvantage of the small ratio of pull-in range to holding range. This is due to the delay times of the filters required in the control circuit.

In order to improve this ratio, it has been suggested to arrange a so-called "finder" or search oscillator between the phase discriminator and the reactance stage of the main oscillator. In the non-synchronized state of the latter, an extraneous control voltage thus is introduced which starts the pull-in of the system. When the pull-in has been completed, the finder oscillator shuts itself off automatically.

In one known embodiment of such an arrangement, disconnection of the finder oscillator is effected by utilizing the resistance of the control line during the synchronization. This resistance is, at the same time, the load resistance for the finder oscillator, and this resistance attains a low value with correct matching of the two oscillators.

The matching of the finder oscillator requires the determination of the dynamic load resistance of the control loop at the point of interconnection of the oscillators. However, this loop resistance can be determined only if the frequency responses of the several parts of the control circuit are known. This requires time consuming measurements and calculations, which must be carried out before each new application. In addition, such a finder oscillator requires a large number of circuit components.

An object of the present invention is to provide an automatic frequency regulating circuit for a main oscillator, of the type including a phase discrimminator and a finder or search oscillator, and which provides for automatic disconnection of the finder oscillator upon synchronization, and which circuit is free of the defects of prior art circuits of this type.

Another object of the invention is to provide an automatic frequency regulating circuit for a main oscillator, of the type including a phase discrimminator and a finder oscillator, and providing for automatic disconnection of the finder oscillator upon synchronization, and by which the ratio of the pull-in range to the holding range is greatly improved.

A further object of the invention is to provide an automatic frequency regulating circuit for a main oscillator, of the type mentioned, which does not require any measurements and requires only a very few calculations.

Still another object of the invention is to provide an automatic frequency regulating circuit for a main oscillator, of the type mentioned, and which requires only a minimum of expense for components.

A further object of the invention is to provide an automatic frequency regulating circuit for a main oscillator, of the type including a phase discriminator and a finder oscillator, and in which the finder oscillator is a saw-tooth oscillator controlled by the differential frequency of the phase discriminator, and which exerts a controlling action on the reactance stage of a main oscillator.

Yet another object of the invention is to provide an automatic frequency regulating circuit for a main oscillator, of the type just mentioned as including a saw-tooth oscillator as the finder oscillator, and in which the control circuit of the saw-tooth oscillator includes a condenser to which the reference frequency is supplied through a rectifier.

A still further object of the invention is to provide an automatic frequency regulating circuit for main oscillator including a frequency discriminator and a saw-tooth oscillator, forming a finder oscillator, and in which the differential frequency produced in the phase discriminator charges a condenser, in the control circuit of the saw tooth oscillator, through a rectifier, and in which a control voltage from the phase discriminator is applied over a resistance to the reactance stage of the main oscillator, with the voltage on the condenser also being applied to such reactance stage.

For an understanding of the principles of the invention, reference is made to the following description of a typical embodiment thereof as illustrated in the accompanying drawings.

In the drawing, the single figure is a part block diagram and part schematic wiring diagram of an automatic frequency regulating circuit embodying the invention.

Referring to the drawing, a free-swinging oscillator 1 is illustrated as being regulated by a reactance stage 2. A reference frequency oscillator 3 is provided, and the frequency of main oscillator 1 is mixed with that of reference oscillator 3 in a phase discriminator 4. The resulting differential frequency is supplied through a resistance R1 to reactance stage 2 of main oscillator 1.

The finder or search oscillator is a saw-tooth oscillator consisting of a unijunction transistor T and of a voltage-doubler rectifier comprising condensers C1 and C2 and diodes G1 and G2. The differential frequency of phase discriminator 4 is supplied to the voltage-doubler rectifier through condenser C1. A resistance R2 is provided to adjust the working point of transistor T, which has an emitter terminal and two base terminals, one connected to a positive potential through resistance R2 and the other grounded.

The illustrated frequency regulating circuit works on the principle of phase comparison. The phase position of the frequency of main oscillator 1 is compared, in phase discriminator 4, with the phase position of the reference frequency of oscillator 3. This phase comparison provides a control voltage which is proportional to the sine of the phase difference of the two frequencies. This control voltage is substantially the differential frequency of the two oscillator frequencies, and is supplied through condenser C1 to the voltage-doubler rectifier of the saw-tooth oscillator.

As compared to an ordinary half wave rectifier, the voltage-doubler rectifier of the saw-tooth oscillator has the effect that the charge on condenser C2 increases at a greater rate, so that a higher voltage acts sooner on the emitter of transistor T. As soon as the voltage on condenser C2 exceeds the threshold voltage of transistor T, the latter becomes conductive and condenser C2 is rapidly discharged. The voltage on condenser C2 is thus applied to the reactance stage 2 which, in turn, shifts the frequency of oscillator 1 in accordance with this voltage.

If, for example, oscillator 1 oscillates with a frequency which is higher than that of reference oscillator 3, a differential frequency is produced in phase discriminator 4. This differential frequency charges condenser C2 and thus shifts the frequency of oscillator 1 to an even higher value. The differential frequency thus increases, resulting in a further charging of condenser C2. The frequency of main oscillator 1 thus continues to rise until the threshold voltage of transistor T is attained and condenser C2 is discharged.

In correspondence with the discharge curve, the frequency of oscillator 1 is shifted to a lower value. When the frequency of oscillator 1 approaches the frequency of reference oscillator 3, the differential frequency decreases, and thus the rate of increase of the charge on condenser C2 decreases. The charge on condenser C2 thus approaches, asymptotically, a value which, acting on reactance stage 2, causes oscillator 1 to oscillate with the reference frequency. The amplitude of the differential frequency is thus practically zero, and the charge remains on condenser C2.

The voltage thus produced acts constantly on the reactance stage. With a relatively small discharge of condenser C2, the differential oscillation increases because of the frequency error resulting from this relatively small charge. Consequently, the necessary larger charge is thus reapplied due to the increase in the differential frequency.

Condenser C1 and resistance R1 form a high pass member which must be so dimensioned that only the differential frequency from phase discriminator 4 is applied through condenser C1, while slow voltage variations act directly on reactance stage 2 through resistance R1. The control time constant of the control loop comprises mainly the capacity of condenser C2 and the ohmic value of resistance R1.

While a specific embodiment of the invention has been shown and described in detail to illustrate the application of the principles of the invention, it will be understood that the invention may be embodied otherwise without departing from such principles.

What is claimed is:

1. Circuit for automatic regulation of the frequency of a main oscillator, having a reactance stage controlling its frequency, with respect to a reference frequency, and controlled, in the case of non-synchronization, with a search voltage from a search oscillator to widen the pull-in range, said circuit comprising, in combination, a phase discriminator connected to said reactance stage; means applying the main oscillator frequency and a reference frequency to said phase discriminator to derive differential frequency, said phase discriminator, in the case of synchronization, having a D.C. output voltage and, in the case of non-synchronization, having an A.C. output voltage; means applying the D.C. output voltage of said phase discriminator to said reactance stage; a search oscillator producing a saw-tooth voltage; a control circuit for said search oscillator and including a condenser; means connecting said condenser to the input of said reactance stage; separator means connected to the output of said phase discriminator and separating the A.C. voltage output thereof from the D.C. voltage ouput thereof; and a rectifier stage connecting said separator means to said condenser to apply the A.C. voltage output of said phase discriminator to said condenser; whereby said sawtooth oscillator is energized in a non-synchronized state of said main oscillator in accordance with the degree of frequency deviation of the latter and is de-energized in the synchronized state of said main oscillator.

2. Circuit for automatic regulation of the frequency of a main oscillator, as claimed in claim 1, in which said rectifier is connected as a voltage doubler.

3. Circuit for automatic regulation of the frequency of a main oscillator, as claimed in claim 1, in which said separator means comprises a resistance connected between said phase discriminator and said reactance stage, and a condenser connected between said phase discriminator and said rectifier stage.

References Cited by the Examiner

UNITED STATES PATENTS

| | | | |
|---|---|---|---|
| 2,833,923 | 5/1958 | Gruen | 331—4 |
| 3,147,448 | 9/1964 | Orlando | 331—4 |
| 3,155,919 | 11/1964 | Baxter et al. | 331—4 |
| 3,189,844 | 6/1965 | MacKenzie | 331—4 |
| 3,210,684 | 10/1965 | Morrison et al. | 331—4 |
| 3,218,571 | 11/1965 | Shannon et al. | 331—4 |

ROY LAKE, *Primary Examiner.*

J. KOMINSKI, *Assistant Examiner.*